United States Patent [19]

Sue

[11] Patent Number: 6,025,021
[45] Date of Patent: *Feb. 15, 2000

[54] MULTILAYER COATING OF A NITRIDE-CONTAINING COMPOUND AND METHOD FOR PRODUCING IT

[75] Inventor: Jiinjen Albert Sue, Carmel, Ind.

[73] Assignee: Praxair S.T. Technology, Inc., Danbury, Conn.

[ * ] Notice: This patent issued on a continued prosecution application filed under 37 CFR 1.53(d), and is subject to the twenty year patent term provisions of 35 U.S.C. 154(a)(2).

[21] Appl. No.: 08/738,534

[22] Filed: Oct. 30, 1996

Related U.S. Application Data

[62] Division of application No. 08/453,405, May 30, 1995, abandoned.

[51] Int. Cl.[7] .................................................. C23C 16/34
[52] U.S. Cl. .................................. 427/250; 427/255.394; 427/225.7
[58] Field of Search ............................... 427/250, 255.2, 427/255.7, 255.394

[56] References Cited

U.S. PATENT DOCUMENTS

| | | | |
|---|---|---|---|
| 4,226,082 | 10/1980 | Nishida | 368/285 |
| 4,337,300 | 6/1982 | Itaba et al. | 428/627 |
| 5,071,693 | 12/1991 | Sue et al. | 428/212 |

FOREIGN PATENT DOCUMENTS

| | | |
|---|---|---|
| 043781 | 6/1981 | European Pat. Off. . |
| 522873 | 1/1993 | European Pat. Off. . |
| 163338 | 10/1981 | Japan . |
| 8064380 | 10/1987 | Japan . |
| 2135337 | 8/1984 | United Kingdom . |

OTHER PUBLICATIONS

Massiani et al., "Corrosion of Sputtered Titanium Nitride Films Deposited on Iron and Stainless Steel", Surface and Coatings Technology, 45 (1991) pp. 115–120. (No Month).
"Electrochemical Study of Titanium Nitride Films obtained by Reactive Sputtering", Y. Massiani, A. Medjahed, P. Gravier, L.Argeme, L.Fedrizzi; Thin Solid Films,191 (1990) 305–316,Preparation and Characterization, copyright Elsevier Sequoia, Netherlands. (No Month).
"A corrosion–Resistant Titanium–Rich Deposit Prepared by Chemical Vapor Deposition at Low Temperature from Tris–(2,2'bipyridine) Titanium", R. Morancho, J.A. Petit, F. Dabosi, G. Constant; J.Electrochem. Soc.: Solid–State Science and Technology, Apr. 1982.
"Corrosion Behavious and Protective Quality of TiN Coatings", T.A. Mantyla, P. Helevirta, T. Lepisto and P.Shtonen; Thin Solid Films, 126 (1985) 275–281, copyright Elsevier Sequoia, Lausanne, SW. (No Month).
"Study of the Behaviour in Acidic Solution of Titanium and Tin Coatings Obtained by Cathodic Sputtering", Y. Massiani, J, Crousier, L.Fedirizzi, A. Cavalerri, P.L. Bonora; Surface and Coatings Technology, 33 (1987) 309–317, copyright Elsevier Sequoia, Netherlands, (No Month).

Optimization of Wear and Corrosion Resistance of Triode–Ion–Plated Nitride Coatings:, E.J. Harju, T.M. Penttinen, A.S. Korhonen, R.Lappalainen; Surface and Coatings Technology, 41 (1990) 157–166, copyright Elsevier Sequoia, Netherlands. (No Month).
"A Study of Corrosion Behavious of TiN Films", a Erdemir, W.B. Carter,R.F. Hochan, Georgia Institute of Technology, Atlanta, GA,;E.I. Meletis, Materials Science and Engineering, 69(1985) 89–93. copyright Elsevier Sequoia, Netherlands (No Month).
"Anodic Photocurrents and Corrosion Currents on Passive and Active–Passive Metals", T.D. Burleigh; Corrosion–Jun. 1989, vol. 45,No. 6.
"Corrosion Behavior of TiN Ion Plated M–50 Bearing Steel", A. Erdemir, R.F. Hochman; J. Materials for Energy Systems, 1985 American Society of Metals, vol. 1, No. 3, Dec. 1985.
"Corrosion of sputtered titanium nitride films deposited on iron and stainless steel", Y. Massiani, A. Medjahed, J.P. Crousier, P. Gravier,I.Rebatel; Surface and Coatings Technology, 45 (1991) 115–120, Elsevier Sequoia/Netherlands. (No Month).
"A study of defects in sputtered TiN coatings by electrochemical polarization", A. Telma, T. Mantyla, P. Kettunen; J.Vac, Sci, Technol A.,vol. 4,No. 6, Nov./Dec. 1986.
"Corrosion Pertormance of Layered Coatings Produced by Physical Vapour Deposition", M.J. Park, a. Leyland, A. Matthews; Surface and Coatings Technology, 43/44 (1990 481–492, Elsevier Sequoia, Netherlands. (No Month).
"Corrosion Wear Properties of Ion Plated TiN Films on M50 Bearing Steel",E.I. Meletis, IIT Research Institute, Chicago, Illinois, USA, A. Erdemir, R.F. Hochman, Georgia Institute of Technology, Atlanta, Georgia, USA. (No Date).
"Improved Corrosion Resistance Of Physical Vapour Deposition Coated TiN and Zrn", U.K. Wilala, I.M. Penttinen, A.S. Korhonen, J. Aromaa, E. Ristolainen; Surface and Coatings Technology,41 (1990) 191–204, copyright Elsevier Sequoia,Netherlands. (No Month).
"Identification of factors affecting the aqueous corrosion properties of (Ti.Al)N–coated steel", J.Aromaa, H.Ronkainen, A.Mahiout,S.P.Hannula; Surface and Coatings Technology,49 (1991) 353–358,Elsevier Sequois,Lausanne (No Month).

*Primary Examiner*—Timothy Meeks
*Attorney, Agent, or Firm*—Blake T. Biederman

[57] ABSTRACT

The invention relates to a wear, erosion and corrosion resistant coating comprising a first layered zone deposited on a substrate which comprises at least one layer of a titanium nitrogen-containing layer with a nitrogen content varying from 0 to 35 atomic percent, a second layered zone deposited on the first layered zone and which comprises at least two layers of a titanium nitrogen-containing compound with a nitrogen content varying from 38 atomic percent to 54 atomic percent of nitrogen.

8 Claims, No Drawings

MULTILAYER COATING OF A NITRIDE-CONTAINING COMPOUND AND METHOD FOR PRODUCING IT

This application is a Division of prior U.S. application Ser. No. 08/453,405 Filing Date May 30, 1995 now abandoned.

FIELD OF THE INVENTION

The invention relates to a wear and erosion and corrosion resistant coating composed of a first layered zone deposited on a substrate which comprises at least one layer of a titanium nitrogen-containing layer with a nitrogen content varying from 0 to 35 atomic percent, and a second layered zone deposited on the first layered zone which comprises at least two layers of a titanium nitride-containing compound which has a nitrogen content varying from 38 atomic percent to 54 atomic percent with the proviso each layer in the second layered zone contains between 6 and 14 atomic percent of nitrogen less than the nitrogen contained in an adjacent layer. The invention also relates to a method of producing the multilayer coated article.

BACKGROUND OF THE INVENTION

Titanium nitride (TiN) coatings are of interest for wear, erosion and corrosion applications because of their high hardness and good chemical stability. Physical vapor deposition (PVD) and chemical vapor deposition (CVD) processes have been successfully used to deposit thin TiN coatings on metal and alloy components for a variety of engineering applications. The benefits from their excellent wear characteristics are well recognized on TiN coated cutting and forming tools, and their good erosion protection from solid particle impact is evident on TiN coated compressor blades in turbomachines. For corrosion protection, however, relatively little success has been reported and then only in a mildly corrosive environment.

The corrosion behavior of TiN coatings depends on their chemistry, microstructure and thickness. A nearly stoichiometric TiN and a N-rich TiN were found to have good corrosion resistance. It was reported in the prior art that a fully dense TiN coating with fine equiaxial grains is superior to many engineering materials in resistance to various corrosive environments. It was also reported that a coating with a columnar structure generally has poor corrosion resistance due to micropores at the boundaries of the columnar grains. In essence, pinholes and micropores in the coating are most detrimental to its corrosion properties. This is because TiN is electrochemically more noble than most engineering materials. Pinholes in the coating may accelerate corrosion in the underlying metal by pitting, crevice or galvanic corrosion mechanisms, particularly in a chloride-containing environment. The corrosion resistance of TiN was also shown to increase with increasing coating thickness due to reducing the occurrence of possible pinholes penetrating through the coating. Typically, it requires a thick coating (20 $\mu$m) to provide full protection of the base metal from the corrosive media. However, it is difficult to deposit such a thick coating uniformly on engineering components due to their complex configuration and the relatively high intrinsic compressive stress in the coating. Clearly, pinholes prevent the TiN coating from being successfully used for a combined corrosion and wear/erosion application. In addition, pinholes are an inherent structural defect in PVD and CVD type TiN coatings.

Many approaches have been utilized to improve the corrosion resistance of TiN coatings by reducing pinhole defects through the use of a metallic intermediate layer or multilayer deposits. U.S. Pat. No. 4,226,082 discloses that a Ti+TiN coating with a Ti-rich intermediate layer adjacent to the base metal provides good properties for an ornamental application in a relatively mild wear and corrosive environment. It was reported in an article by Massiani et al. in Surface Coating Technologies 45 (1991) 115, that a TiN coating with a Ti intermediate layer improves corrosion protection over a single layer TiN coating on AISI 430 and AISI 304 stainless steel and Fe substrates in $H_2SO_4$ and NaCl solutions. Japanese Patent No. 8,064,380 discloses that a Ti layer laminating alternately with TiN can inhibit the formation of pinholes passing through the coating layer to protect the coated article from localized corrosion attack.

An object of the present invention is to provide a multilayer coated substrate having good wear, erosion and corrosion resistance characteristics which is effective in reducing interconnected pinholes or pores through the coating to the substrate.

Another object of the present invention is to provide a multilayer coated substrate comprising a first zone comprising at least one layer of a titanium nitrogen-containing layer deposited between the surface of the substrate and a second zone that comprises at least two layers of a titanium nitride-containing compound.

Another object of the invention is to provide a method for producing a multilayered coating of a titanium nitrogen-containing compound that can effectively eliminate galvanic corrosion attack within the coating layers.

The above and further objects and advantages of this invention will become apparent upon consideration of the following description.

SUMMARY OF THE INVENTION

The invention relates to a multilayer coated substrate comprising a substrate coated with a first layered zone disposed on the substrate which comprises at least one layer of a titanium nitrogen-containing layer which contains a nitrogen content varying from 0 to 35 atomic percent, preferably from 0 to 24 atomic percent, with the proviso that if the first zone has more than one titanium nitrogen-containing layer then each titanium nitrogen-containing layer will contain between 10 and 20 atomic percent of nitrogen, preferably between 5 and 15 atomic percent of nitrogen, different than an adjacent underlayer, and a second layered zone comprising at least two layers of a titanium nitride-containing compound in which each layer contains from 38 atomic percent to 54 atomic percent of nitrogen and for wear and erosion characteristics the atomic percent of nitrogen could be from 38 atomic percent to 45 atomic percent while for corrosion characteristics the atomic percent of nitrogen could be from 45 atomic percent to 54 atomic percent of nitrogen, with the proviso that each layer contains between 6 atomic percent and 14 atomic percent of nitrogen, preferably between 6 atomic percent and 10 atomic percent of nitrogen, different than an adjacent underlayer. In another embodiment of the invention, the first layered zone could be a layer of titanium or a layer of titanium nitrogen-containing layer having between above 0 and 35 atomic percent of nitrogen.

The invention also relates to a method for producing a multilayer titanium nitride-containing coating on a substrate comprising the steps:

(a) placing a substrate to be coated in a chamber containing a titanium based target and a nitrogen-containing gas mixture;

(b) evaporating the titanium from the titanium based target to produce a titanium vapor to react with the nitrogen in the nitrogen-containing gas mixture to form a first layered zone of at least one nitrogen-containing titanium layer of 0 to 35 atomic percent nitrogen on the substrate;

(c) changing the ratio of nitrogen to titanium in step (b) to form a second layered zone of a titanium nitride-containing layer that has a nitrogen content between 38 and 54 percent of nitrogen on the first layered zone of the coated substrate; and (d) repeating step (c) at least once to form a multilayer coating in said second layered zone of at least two layers in which each layer contains 38 to 54 atomic percent of nitrogen and each layer contains between 6 and 14 atomic percent of nitrogen different than the nitrogen contained in an adjacent underlayer. The ratio of nitrogen to titanium can be changed by altering the current, changing the flow of nitrogen or a combination of both.

It has been found that a great difference in free corrosion potential exists between pure titnaium and titanium nitride which cause galvanic corrosion attack to the pure titanium layer in a chloride containing media. It has been found in accordance with this invention that a multilayered coating with an arrangement to reduce the electro-chemical potential difference between an adjacent layer can effectively eliminate the potential galvanic corrosion attack in the coating layer as well as the substrate. Table 1 shows the free corrosion potential [mV (SCE)] for various TiN-containing compounds along with titanium and stainless steel.

TABLE 1

Galvanic Series of TiNx Coatings, Ti, and 17-4 PH in 3.5 wt. % NaCl Solution

| Materials | Free Corrosion Potential mV (SCE) |
|---|---|
| $TiN_{0.48}$ | −314 |
| $TiN_{0.63}$ | −178 |
| $TiN_{0.66}$ | −212 |
| $TiN_{0.88}$ | −198 |
| $TiN_{0.89}$ | −129 |
| $TiN_{0.92}$ | −156 |
| $TiN_{0.97}$ | −168 |
| $TiN_{1.0}$ | −85 |
| Ti | −446 |
| 17-4 PH | −561 |

One embodiment for producing a multilayer nitride-containing coating on a substrate would comprise the steps:

(a) placing a substrate to be coated in a vapor deposition chamber having an anode and containing a titanium-based cathode along with a nitrogen-containing gas mixture;

(b) applying a voltage across the cathode and anode to establish a current to effect evaporation of the titanium from the titanium-based cathode to produce a titanium vapor to react with the nitrogen in the nitrogen-containing gas mixture to form a nitrogen-containing titanium layer of a desired nitrogen content on the substrate;

(c) changing the ratio of nitrogen to titanium in step (b) to form another titanium nitride containing layer on the coated substrate that has a nitrogen content of a specific atomic percent of nitrogen different than the nitrogen contained in the previously deposited coating; and (d) repeating step (c) at least once to form a multilayer coating of at least three layers.

Preferably, the nitrogen-containing gas mixture could be argon-nitrogen; krypton nitrogen; helium-nitrogen; xenon-nitrogen; neon-nitrogen or the like.

The multilayer coating can be deposited by using conventional process techniques such as chemical vapor deposition and physical vapor deposition such as arc evaporation processes, dc and rf magnetron sputtering, reactive ion plating and the like. The changing of the ratio of nitrogen to titanium for the alternate lamellar layers will interrupt the grain growth process of the coating compound so that the grain size of the compound is no larger than the thickness of the individual layers.

The thickness of the individual layers can vary greatly as for example between 0.1 to 5 microns thick, preferably about 1 micron thick. In accordance with this invention, the number of layers of a titanium nitride-containing compound forming the second zone of the coating of this invention can vary from two up to any number desired for a particular application. Generally, 5 to 40 layers of the coating would be suitable for most applications employing turbomachines that operate in a dust environment. For most applications, 15 to 40 layers would be preferable. Preferably the thickness of the first zone could be between 1 and 5 microns thick, preferably between 3 and 5 microns thick and the thickness of the second zone could be between 3 and 35 microns thick, preferably between 8 and 35 microns thick.

Preferably, the total thickness of the first layered zone and the second layered zone should be between 6 to 40 microns.

The multilayer coating of this invention is ideally suited for coating substrates made of materials such as titanium, aluminum, nickel, cobalt, iron, manganese, copper, alloys thereof and the like.

As recited above, pinholes and micropores are generally inherent structural defects in PVD and CVD types of TiN coatings. These defects, however, may not be completely eliminated. The subject invention relates to a multilayer coating to enhance the overall corrosion and wear/erosion performance, by reducing the occurrence of interconnecting pinholes and micropores through the layered structure of the coating and reducing the galvanic corrosion in the coating and the base metal. To accomplish this, a Ti(N) layer with a microstructure of graded nitrogen content or multilayer with varying nitrogen content from 0 to 35 atomic percent nitrogen should be used as an intermediate layer between the $TiN_x$ layered coating (second zone) and the base metal. In such an arrangement using an intermediate layer, the free corrosion potential differences between Ti(N), $TiN_x$ coating, and the base metal are greatly reduced and thus galvanic corrosion can be prevented. The outermost $TiN_x$ layer which is exposed to the corrosion/wear/erosion environment should have a nitrogen content less than the adjacent $TiN_x$ layer. The difference in nitrogen content between each of the layers in the second zone should be between 6 atomic percent and 14 atomic percent. Therefore, the outer layer is chemically more active (anode) compared to the adjacent layer (cathode). As a result, the corrosion will be confined in the outermost layer even with the presence of pinholes.

EXAMPLE

Cyclic polarization studies are carried out to evaluate the pitting corrosion behavior of monolayer TiN coatings and multilayer $TiN/TiN_x$ coatings on a 17-4 PH substrate (stainless steel) in a 3.56 wt % NaCl solution at 25° C. The thicknesses of the stoichiometric monolayer TiN coatings were 2, 8 and 15.4 μm. Pitting corrosion of the 17-4 PH substrate occurred in all the TiN coated samples. The critical pitting potential of the TiN coating and the coating including the Ti underlayer, $E_{pit}$(TiN) and $E_{pit}$(TiN+Ti) respectively, increased with increasing total coating thickness.

Multilayer TiN/TiN$_x$ coatings with various coating thicknesses from 7.1 to 18.5 μm and various layer thicknesses from 0.7 to 2.8 μm were investigated. A typical cyclic polarization curve without occurrence of pitting corrosion for a multilayer coatings with 14.2 μm coating thickness and 1.6 μm layer thickness was noted. An active/passive transition occurred at a critical current density of 0.12 mA cm$^{-2}$ and potential −80 mV (SCE), followed by passivation at a potential greater than −10 mV (SCE). The active/passive transition probably was a result of the dissolution of corrosion products from the surface of the coating which led to the formation of pinholes within the coating layers. This is a distinct polarization characteristic for a multilayer TiN/TiN$_x$ coating in a 3.56 wt. % NaCl solution.

Table 2 summarizes the cyclic polarization test results of the multilayer and monolayer coatings. The coating thicknesses of the multilayer and monolayer coatings included approximately 1 μm Ti(N) and 1.5 μm Ti underlayers, respectively. The pitting corrosion resistance of the coating system was measured in terms of $E_{pit}$-$E_{corr}$. Data show $E_{pit}$-$E_{corr}$ as a linear function of coating thickness for multilayer coatings and monolayer coatings with and without a Ti underlayer. The result had no direct correlation in a quantitative manner with that in a specific environment in service. However, based on $E_{pit}$-$E_{corr}$, for a given coating thickness, the multilayer coating clearly was much more pitting corrosion resistant that the monolayer coating with and without the Ti underlayer. For a given coating thickness, the multilayer TiN/TiN$_x$ coating exhibits substantially better protection for the 17-4 PH base metal from pitting corrosion in a chloride environment than a monolayer TiN coating.

Although specific embodiments of this invention have been described, it should be understood that various modifications may be made without departing from the spirit of this invention.

TABLE 2

| Coating | Total No. of Coating Layers | Total Coating Thickness (μm) | Layer Thickness (μm) | $E_{pit}$–$E_{corr}$ (mV (SCE)) |
|---|---|---|---|---|
| TiN/TiN$_{0.67}$ | 6 | 8.8 | 1.3 | 1073 |
| TiN/TiN$_{0.67}$ | 6 | 10.6 | 1.6 | 1064 |
| TiN/TiN$_{0.67}$ | 6 | 13.0 | 2.0 | 1460 |
| TiN/TiN$_{0.67}$ | 6 | 18.0 | 2.8 | * |
| TiN/TiN$_{0.67}$ | 7 | 7.1 | 0.87 | 708 |
| TiN/TiN$_{0.67}$ | 7 | 8.0 | 1.0 | 966 |
| TiN/TiN$_{0.67}$ | 7 | 8.8 | 1.1 | 1150 |
| TiN/TiN$_{0.67}$ | 7 | 12.5 | 1.6 | 1500 |
| TiN/TiN$_{0.67}$ | 8 | 10.6 | 1.2 | * |
| TiN/TiN$_{0.67}$ | 8 | 14.2 | 1.6 | * |
| TiN/TiN$_{0.67}$ | 11 | 8.7 | 0.7 | 1180 |
| TiN/TiN$_{0.67}$ | 11 | 18.5 | 1.6 | * |
| TiN | 1 | 2.0 | 2.0 | 32 |
| TiN | 1 | 8.0 | 8.0 | 271 |
| TiN | 1 | 15.4 | 15.0 | 572 |
| TiN + Ti | 2 | 3.5 | —** | 128 |
| TiN + Ti | 2 | 9.5 | —** | 776 |
| TiN + Ti | 2 | 16.9 | —** | 1035 |

*No pitting corrosion occurred
**This coating had a thickness of 1.0 μm for the titanium layer

What is claimed is:

1. A method for producing a multilayer titanium nitrogen-containing coating on a substrate comprising the steps:

(a) placing a substrate to be coated in a chamber containing a titanium based target and a nitrogen-containing gas mixture;

(b) evaporating the titanium from the titanium based target to produce a titanium vapor to interact with the nitrogen in the nitrogen-containing gas mixture to form a first zone of at least one titanium layer containing between 0 and 24 atomic percent nitrogen on the substrate;

(c) changing the ratio of nitrogen to titanium in step (b) to form a second zone comprising a titanium nitride-containing layer on the first zone of the coated substrate that has a nitrogen content between 38 and 54 percent of nitrogen; and (d) repeating step (c) at least once to form a multilayer coating of at least two layers in which each layer contains 38 to 54 atomic percent of nitrogen and each layer in the second zone contains between 6 and 14 atomic percent of nitrogen different than the amount of nitrogen contained in an adjacent underlayer.

2. The method of claim 1 wherein in step (b) the substrate contains a titanium layer.

3. The method of claim 2 wherein in step (b) the first zone contains at least one titanium nitrogen-containing layer deposited over the titanium layer.

4. The method of claim 1 wherein said nitrogen-containing gas mixture is selected from the group consisting of argon-nitrogen; krypton-nitrogen; helium-nitrogen; xenon-nitrogen; and neon-nitrogen.

5. The method of claim 4 wherein said nitrogen-containing gas mixture is argon-nitrogen.

6. The method of claim 1 wherein said substrate is selected from the group consisting of titanium, iron, aluminum, nickel, cobalt, manganese, copper and alloys thereof.

7. The method of claim 1, wherein the total thickness of the multilayer coating in the first and second zones is from 6 to 40 microns thick.

8. The method of claim 1 wherein the first zone contains multiple layers and each layer of said multiple layers contains between 5 and 15 atomic percent nitrogen different than an adjacent underlayer.

* * * * *